(12) United States Patent
Lee et al.

(10) Patent No.: US 9,150,952 B2
(45) Date of Patent: Oct. 6, 2015

(54) DEPOSITION SOURCE AND DEPOSITION APPARATUS INCLUDING THE SAME

(75) Inventors: Jong-Woo Lee, Yongin (KR); Young-Soo Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 845 days.

(21) Appl. No.: 13/413,615

(22) Filed: Mar. 6, 2012

(65) Prior Publication Data

US 2013/0019805 A1  Jan. 24, 2013

(30) Foreign Application Priority Data

Jul. 19, 2011  (KR) .................. 10-2011-0071546

(51) Int. Cl.
*C23C 16/00* (2006.01)
*C23C 14/12* (2006.01)
*C23C 14/24* (2006.01)

(52) U.S. Cl.
CPC .............. *C23C 14/12* (2013.01); *C23C 14/243* (2013.01)

(58) Field of Classification Search
CPC .............................. C23C 14/243; C23C 14/12
USPC ......................................................... 118/726
See application file for complete search history.

(56) References Cited

U.S. PATENT DOCUMENTS

| 5,454,847 | A | 10/1995 | Jacoboni et al. |
| 6,274,198 | B1 | 8/2001 | Dautartas |
| 6,371,451 | B1 | 4/2002 | Choi |
| 6,749,906 | B2 | 6/2004 | Van Slyke |
| 7,322,248 | B1 | 1/2008 | Long |
| 2001/0006827 | A1 | 7/2001 | Yamazaki et al. |
| 2002/0076847 | A1 | 6/2002 | Yamada et al. |
| 2002/0168577 | A1 | 11/2002 | Yoon |
| 2003/0101937 | A1 | 6/2003 | Van Slyke et al. |
| 2003/0168013 | A1 | 9/2003 | Freeman et al. |
| 2003/0221614 | A1 | 12/2003 | Kang et al. |
| 2003/0232563 | A1 | 12/2003 | Kamiyama et al. |
| 2004/0016907 | A1 | 1/2004 | Shi |
| 2004/0127066 | A1 | 7/2004 | Jung |
| 2004/0134428 | A1 | 7/2004 | Sasaki et al. |

(Continued)

FOREIGN PATENT DOCUMENTS

| EP | 1 413 644 A2 | 4/2004 |
| EP | 1 418 250 A2 | 5/2004 |

(Continued)

OTHER PUBLICATIONS

Machine translation for JP 2001-52862, Feb. 23, 2001, 20 pages.

(Continued)

*Primary Examiner* — Keath Chen
(74) *Attorney, Agent, or Firm* — Christie, Parker & Hale, LLP

(57) ABSTRACT

A deposition source including: a dopant vaporization source; a first host vaporization source including a first vaporization source unit on a side of the dopant vaporization source and a second vaporization source unit on another side of the dopant vaporization source; and a second host vaporization source including a third vaporization source unit on the side of the dopant vaporization source and arranged in parallel with the first vaporization source unit, and a fourth vaporization source unit on the another side of the dopant vaporization source and arranged in parallel with the second vaporization source unit.

16 Claims, 6 Drawing Sheets

(56) References Cited

U.S. PATENT DOCUMENTS

| | | | |
|---|---|---|---|
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0001546 A1 | 1/2005 | Yamaguchi | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0039684 A1 | 2/2005 | Yi et al. | |
| 2005/0166842 A1 | 8/2005 | Sakamoto | |
| 2006/0011136 A1 | 1/2006 | Yamazaki et al. | |
| 2006/0045958 A1* | 3/2006 | Abiko et al. | 427/66 |
| 2006/0144325 A1 | 7/2006 | Jung et al. | |
| 2006/0169211 A1 | 8/2006 | Kim et al. | |
| 2006/0174829 A1 | 8/2006 | An et al. | |
| 2006/0205101 A1 | 9/2006 | Lee et al. | |
| 2007/0077358 A1 | 4/2007 | Jeong et al. | |
| 2007/0178708 A1 | 8/2007 | Ukigaya | |
| 2007/0195844 A1 | 8/2007 | Ma et al. | |
| 2008/0018236 A1 | 1/2008 | Arai et al. | |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0017192 A1 | 1/2009 | Matsura | |
| 2009/0124033 A1 | 5/2009 | Moriyama | |
| 2009/0229524 A1 | 9/2009 | Kim et al. | |
| 2009/0232976 A1 | 9/2009 | Yoon et al. | |
| 2010/0126417 A1* | 5/2010 | Hasegawa et al. | 118/667 |
| 2010/0297348 A1 | 11/2010 | Lee et al. | |
| 2011/0104398 A1* | 5/2011 | Korevaar et al. | 427/561 |
| 2011/0165327 A1 | 7/2011 | Park et al. | |

FOREIGN PATENT DOCUMENTS

| | | |
|---|---|---|
| EP | 1 518 940 A1 | 3/2005 |
| JP | 04-272170 | 9/1992 |
| JP | 05-098425 | 4/1993 |
| JP | 2000-68054 | 3/2000 |
| JP | 2001-52862 | 2/2001 |
| JP | 2001-93667 | 4/2001 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2004-43898 | 2/2004 |
| JP | 2004-091858 | 3/2004 |
| JP | 2004-103269 | 4/2004 |
| JP | 2004-103341 | 4/2004 |
| JP | 2004-199919 | 7/2004 |
| JP | 2005-44592 | 2/2005 |
| JP | 2005-50747 | 2/2005 |
| JP | 2005-235568 | 9/2005 |
| JP | 2005-293968 | 10/2005 |
| JP | 2005-296737 | 10/2005 |
| JP | 2006-275433 | 10/2006 |
| JP | 2007-47293 | 2/2007 |
| JP | 2008-121098 | 5/2008 |
| JP | 2009-19243 | 1/2009 |
| JP | 2009-87910 | 4/2009 |
| KR | 10-0257219 | 2/2000 |
| KR | 10-2000-0019254 | 4/2000 |
| KR | 10-2000-0023929 | 5/2000 |
| KR | 10-2001-0059939 | 7/2001 |
| KR | 10-0827760 | 7/2001 |
| KR | 10-2002-0000201 | 1/2002 |
| KR | 10-0726132 | 5/2002 |
| KR | 10-2002-0050922 | 6/2002 |
| KR | 10-0698033 | 7/2002 |
| KR | 10-0405080 | 11/2002 |
| KR | 10-0463212 | 11/2002 |
| KR | 10-2002-0090934 | 12/2002 |
| KR | 10-2003-0091947 | 12/2003 |
| KR | 10-2003-0093959 | 12/2003 |
| KR | 10-2004-0034537 | 4/2004 |
| KR | 10-2004-0043360 | 5/2004 |
| KR | 10-2004-0050045 | 6/2004 |
| KR | 10-0646160 | 7/2004 |
| KR | 10-2004-0069281 | 8/2004 |
| KR | 10-2004-0084747 | 10/2004 |
| KR | 10-2005-0018234 | 2/2005 |
| KR | 2005-0028943 | 3/2005 |
| KR | 2005-0039140 | 4/2005 |
| KR | 10-0520159 | 5/2005 |
| KR | 10-0700466 | 8/2005 |
| KR | 10-2006-0008602 | 1/2006 |
| KR | 10-2006-0018745 | 3/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0081943 | 7/2006 |
| KR | 10-2006-0083510 | 7/2006 |
| KR | 10-0687007 | 9/2006 |
| KR | 10-2006-0104675 | 10/2006 |
| KR | 10-2006-0104677 | 10/2006 |
| KR | 10-2006-0109561 | 10/2006 |
| KR | 10-2006-0109627 | 10/2006 |
| KR | 10-0797787 | 12/2006 |
| KR | 10-2007-0025164 | 3/2007 |
| KR | 10-0696547 | 3/2007 |
| KR | 10-0711885 | 3/2007 |
| KR | 10-2007-0035796 | 4/2007 |
| KR | 10-2007-0050793 | 5/2007 |
| KR | 10-0723627 | 5/2007 |
| KR | 10-0815265 | 5/2007 |
| KR | 10-2007-0078713 | 8/2007 |
| KR | 10-2007-0080635 | 8/2007 |
| KR | 10-2007-0101842 | 10/2007 |
| KR | 10-2007-0105595 | 10/2007 |
| KR | 10-0770653 | 10/2007 |
| KR | 2007-0098122 | 10/2007 |
| KR | 10-2007-0114094 | 11/2007 |
| KR | 10-2008-0001184 | 1/2008 |
| KR | 10-2008-0003720 | 1/2008 |
| KR | 10-0800125 | 1/2008 |
| KR | 10-0823508 | 4/2008 |
| KR | 10-0839380 | 5/2008 |
| KR | 10-2008-0060400 | 7/2008 |
| KR | 10-2008-0061132 | 7/2008 |
| KR | 10-2008-0062212 | 7/2008 |
| KR | 10-2009-0038733 | 4/2009 |
| KR | 10-2009-0047953 | 5/2009 |
| KR | 10-2009-0097453 | 9/2009 |
| KR | 10-2011-0082418 | 7/2011 |

OTHER PUBLICATIONS

Machine translation for JP 2003-3250, Jan. 8, 2003, 25 pages.
KIPO Office Action dated Jan. 6, 2012, for Korean Patent Application No. 10-2010-0000897 (4 sheets).
SIPO Office Action dated Aug. 20, 2015 for corresponding Chinese Patent Application No. 201210109395.X (6 pages).

* cited by examiner

DEPOSITION SOURCE AND DEPOSITION APPARATUS INCLUDING THE SAME

CROSS-REFERENCE TO RELATED APPLICATION

This application claims priority to and the benefit of Korean Patent Application No. 10-2011-0071546, filed on Jul. 19, 2011 in the Korean Intellectual Property Office, the entire content of which is incorporated herein by reference.

BACKGROUND

1. Field

Aspects of embodiments of the present invention relate to a deposition source and a deposition apparatus including the deposition source.

2. Description of the Related Art

Various methods are employed in order to form minute thin films for use in electronic devices. In particular, a flat panel display device is manufactured by forming a plurality of thin films, and thus it is important to improve the characteristics of the thin films.

From among flat panel display devices, an organic light emitting display device has been regarded as a next generation display device due to advantages such as a large viewing angle, excellent contrast, and rapid response speed in comparison to other flat panel display devices.

In the organic light emitting display device, an organic light emitting layer emitting visual light and an organic layer near the organic light emitting layer are formed by using various methods. In particular, a vacuum deposition method is frequently used due to its simple process. In the vacuum deposition method, a deposition material in a powder or solid state is filled into a furnace and a deposition film is formed on a desired region by heating the furnace.

SUMMARY

According to aspects of embodiments of the present invention, a deposition source is capable of increasing uniformity of vacuum deposition regions of host and dopant materials and a vacuum deposition ratio thereof, and a deposition apparatus includes the deposition source.

According to an embodiment of the present invention, a deposition source includes: a dopant vaporization source; a first host vaporization source including a first vaporization source unit on a side of the dopant vaporization source and a second vaporization source unit on another side of the dopant vaporization source; and a second host vaporization source including a third vaporization source unit on the side of the dopant vaporization source and arranged in parallel with the first vaporization source unit, and a fourth vaporization source unit on the another side of the dopant vaporization source and arranged in parallel with the second vaporization source unit.

The dopant vaporization source may include a linear vaporization source.

A direction in which a plurality of nozzles of the linear vaporization source are arranged and a direction in which the first vaporization source unit and the second vaporization source unit are arranged may cross each other.

The direction in which the plurality of nozzles of the linear vaporization source are arranged and the direction in which the first vaporization source unit and the second vaporization source unit are arranged may be perpendicular to each other.

The dopant vaporization source may include a point source.

The dopant vaporization source may include: a first point source between the first vaporization source unit and the second vaporization source unit; and a second point source between the third vaporization source unit and the fourth vaporization source unit.

The first vaporization source unit and the second vaporization source unit may be symmetrical to each other with respect to the dopant vaporization source.

The third vaporization source unit and the fourth vaporization source unit may be symmetrical to each other with respect to the dopant vaporization source.

The first vaporization source unit and the second vaporization source unit may include linear vaporization sources.

Each of the first vaporization source unit and the second vaporization source unit may include a plurality of nozzles arranged in a same direction as a direction in which the first vaporization source unit and the second vaporization source unit are arranged.

Each of the third vaporization source unit and the fourth vaporization source unit may include a plurality of nozzles arranged in a same direction as a direction in which the third vaporization source unit and the fourth vaporization source unit are arranged.

A direction in which the first vaporization source unit and the second vaporization source unit are arranged and a direction in which the third vaporization source unit and the fourth vaporization source unit are arranged may be parallel to each other.

The first vaporization source unit and the second vaporization source unit may have a same size and shape.

The third vaporization source unit and the fourth vaporization source unit may have a same size and shape.

The first host vaporization source may further include a first heating unit surrounding a first crucible of the first vaporization source unit and a second crucible of the second vaporization source unit, the first heating unit being configured to heat the first crucible and the second crucible.

The second host vaporization source may further include a second heating unit surrounding a third crucible of the third vaporization source unit and a fourth crucible of the fourth vaporization source unit, the second heating unit being configured to heat the third crucible and the fourth crucible.

The first host vaporization source may further include a first heating unit surrounding a first crucible of the first vaporization source unit and being configured to heat the first crucible, and a second heating unit surrounding a second crucible of the second vaporization source unit and being configured to heat the second crucible.

The second host vaporization source may further include a third heating unit surrounding a third crucible of the third vaporization source unit and being configured to heat the third crucible, and a fourth heating unit surrounding a fourth crucible of the fourth vaporization source unit and being configured to heat the fourth crucible.

According to another embodiment of the present invention, a deposition apparatus includes a chamber, and a deposition source to deposit a deposition material onto a deposition target material transferred to the chamber, and the deposition source includes: a dopant vaporization source; a first host vaporization source including a first vaporization source unit on a side of the dopant vaporization source and a second vaporization source unit on another side of the dopant vaporization source; and a second host vaporization source including a third vaporization source unit on the side of the dopant vaporization source and arranged in parallel with the first vaporization source unit, and a fourth vaporization source unit on the another side of the dopant vaporization source and arranged in parallel with the second vaporization source unit.

The dopant vaporization source may include a linear vaporization source.

The dopant vaporization source may include: a first point source between the first vaporization source unit and the second vaporization source unit; and a second point source between the third vaporization source unit and the fourth vaporization source unit.

The first vaporization source unit and the second vaporization source unit may be symmetrical to each other with respect to the dopant vaporization source, and the third vaporization source unit and the fourth vaporization source unit may be symmetrical to each other with respect to the dopant vaporization source.

The first vaporization source unit and the second vaporization source unit may include linear vaporization sources.

BRIEF DESCRIPTION OF THE DRAWINGS

The above and other features and aspects of the present invention will become more apparent by describing in further detail some exemplary embodiments thereof with reference to the attached drawings, in which.

DETAILED DESCRIPTION

Some exemplary embodiments of the present invention are described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
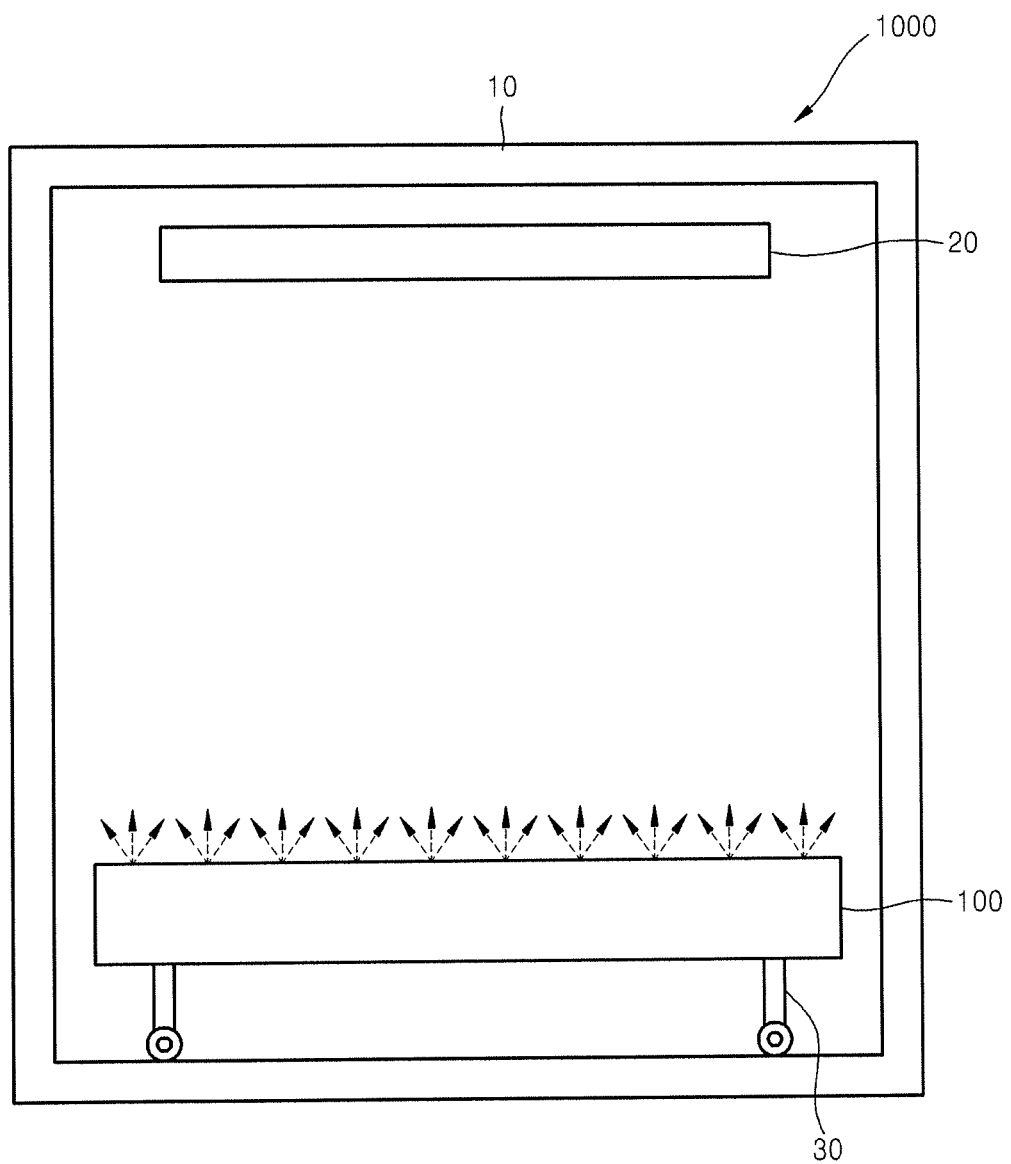
FIG. 1 is a schematic front view of a deposition apparatus including a deposition source, according to an embodiment of the present invention.
Figure 2:
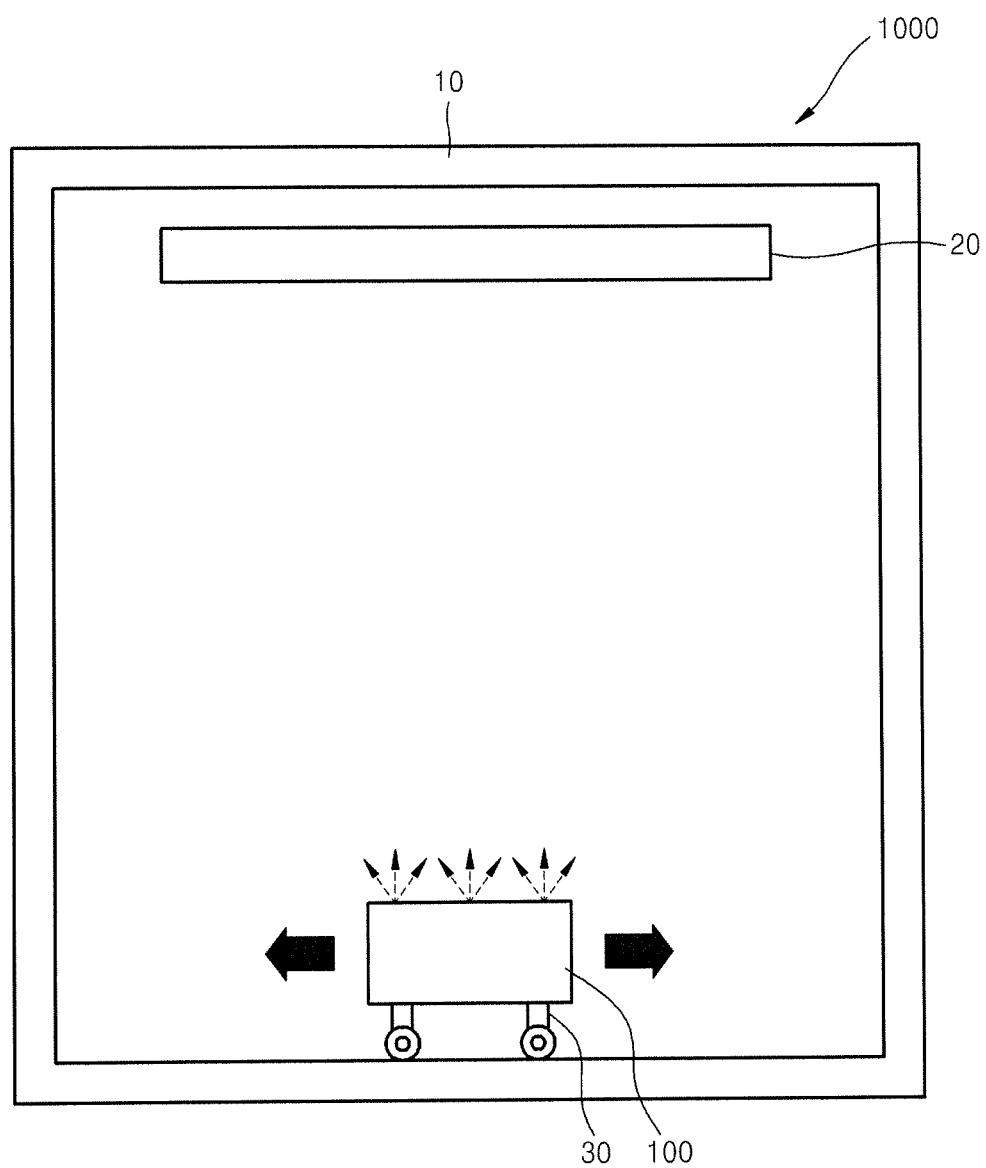
FIG. 2 is a schematic side view of the deposition apparatus of FIG. 1.

FIG. 1 is a schematic front view of a deposition apparatus 1000 including a deposition source 100, according to an embodiment of the present invention. FIG. 2 is a schematic side view of the deposition apparatus 1000 illustrated in FIG. 1. For example, FIG. 2 may be a left side view or a right side view of the deposition apparatus 1000.

Referring to FIGS. 1 and 2, according to an embodiment of the present invention, the deposition apparatus 1000 includes a substrate 20 and a deposition source 100 in a chamber 10.

In order to maintain a vacuum or low-pressure state, one or more pumps (not shown) may be connected to the chamber 10. Also, one or more inlets and/or outlets (not shown) may be formed on side surfaces of the chamber 10 such that the substrate 20 may be moved into or out of the chamber 10.

The substrate 20 is a target on which a desired material is to be deposited, and may be fixed by a clamp or a supporter. A deposition process may be performed after the substrate 20 is fixed.

The deposition source 100 is disposed to face the substrate 20 in the chamber 10. The deposition source 100 may linearly extend in a longitudinal direction of the substrate 20.

Although the deposition source 100 linearly extends in one direction, as illustrated in FIG. 1, a width of the deposition source 100 in the other direction is less than a length of the substrate 20, as illustrated in FIG. 2.

Since the deposition source 100 linearly extends in one direction, the deposition source 100 may move in order to deposit the material on the entire surface of the substrate 20. In one embodiment, a moving unit 30 that moves in one direction or multiple directions, as depicted in FIG. 2, is disposed under the deposition source 100. Due to the moving unit 30, the deposition source 100 may rectilinearly move and uniformly or substantially uniformly deposit the material on the substrate 20.

Figure 3:
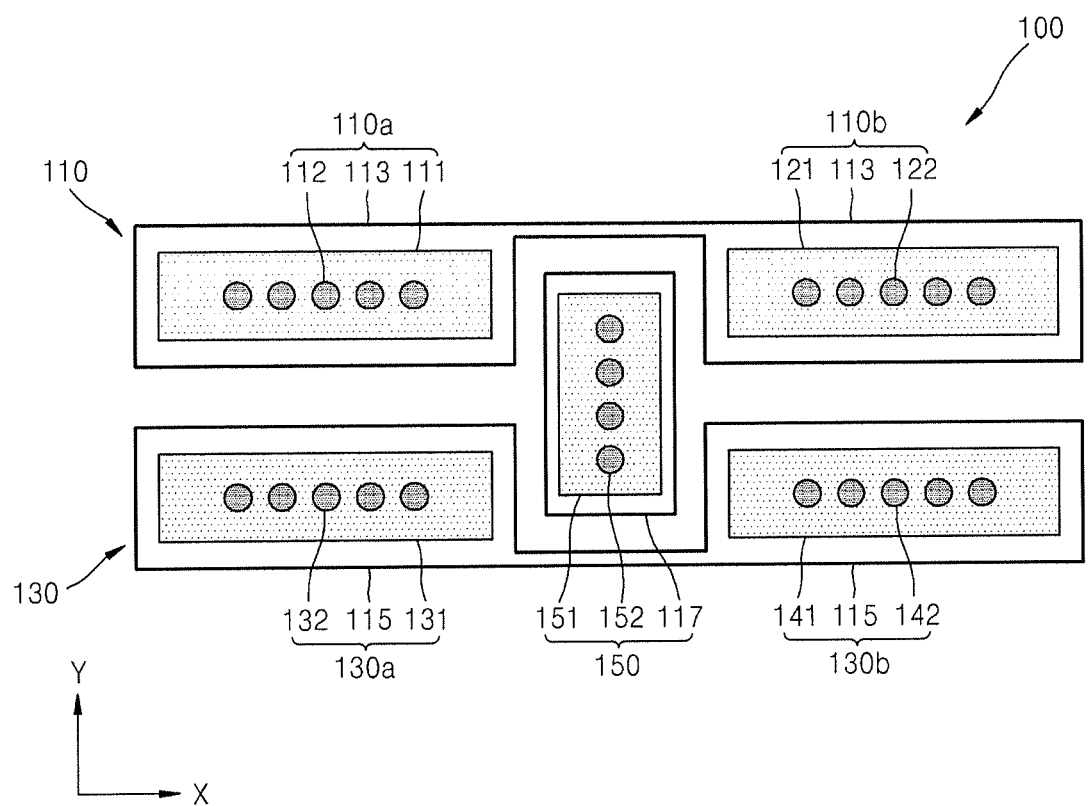
FIG. 3 is a plan view of the deposition source of FIG. 1 according to an embodiment of the present invention.

FIG. 3 is a plan view of the deposition source 100 of FIG. 1 according to an embodiment of the present invention.

The deposition source 100 includes a first host vaporization source 110, a second host vaporization source 130, and a dopant vaporization source 150. The first host vaporization source 110 vaporizes a first host material. The second host vaporization source 130 vaporizes a second host material. The dopant vaporization source 150 vaporizes a dopant material.

The first host vaporization source 110 may include a first vaporization source unit 110a and a second vaporization source unit 110b. The first vaporization source unit 110a may include a crucible 111 and a first heating unit 113. The second heating source unit 110b may include a crucible 121 and the first heating unit 113. The crucibles 111 and 121 are filled with deposition materials used for deposition. In one embodiment, a first host material for forming an organic material included in an organic light emitting diode (OLED) may be filled in a solid or powder state into the crucibles 111 and 121. However, the present invention is not limited thereto, and various deposition materials in various states may be filled into the crucibles 111 and 121.

The crucibles 111 and 121 may linearly extend in a direction (e.g., in an X-axis direction). Longitudinal directions of the crucibles 111 and 121 may correspond to a longitudinal direction of the substrate 20 illustrated in FIG. 1, on which the deposition material is to be deposited.

A plurality of nozzles 112 and 122 are formed in top surfaces of the crucibles 111 and 121, i.e. surfaces facing the substrate 20. When the first host material filled in the crucibles 111 and 121 is heated, the first host material moves through the nozzles 112 and 122 to the substrate 20. The shapes, the sizes, and the number of the nozzles 112 and 122 may vary based on the size of the substrate 20, properties of the deposition material, and conditions of a deposition process.

The first heating unit 113 may be disposed around (e.g., surrounding) the crucibles 111 and 121. The first heating unit 113 may include coils in, for example, a sine wave or zigzag pattern, and the coils may be connected to one or more external power sources (not shown).

The first heating unit 113 vaporizes the first host material filled in the crucibles 111 and 121 by providing thermal energy to the crucibles 111 and 121. The first heating unit 113 may be disposed on outer circumferences of the crucibles 111 and 121 so as to surround the crucibles 111 and 121. The first heating unit 113, in one embodiment, is connected to an external power source. The two crucibles 111 and 121, in one embodiment, are heated by the single first heating unit 113, and thus thermal energy may be uniformly or substantially uniformly supplied to the crucibles 111 and 121.

The second host vaporization source 130 may include a third vaporization source unit 130a and a fourth vaporization source unit 130b. The third vaporization source unit 130a may include a crucible 131 and a second heating unit 115. The fourth vaporization source unit 130b may include a crucible 141 and the second heating unit 115. The crucibles 131 and 141 are filled with deposition materials used for deposition. In one embodiment, a second host material for forming an organic material included in an OLED may be filled in a solid or powder state into the crucibles 131 and 141. However, the present invention is not limited thereto and various deposition materials in various states may be filled into the crucibles 131 and 141. Vacuum deposition is performed on the first and second host materials and the dopant material.

The crucibles 131 and 141 may linearly extend in a direction (e.g., in the X-axis direction) like the crucibles 111 and 121. In one embodiment, the crucibles 131 and 141 and the crucibles 111 and 121 may linearly extend in one direction (e.g., in the X-axis direction) and may be disposed in parallel with each other. Longitudinal directions of the crucibles 131 and 141 may correspond to the longitudinal direction of the substrate 20 illustrated in FIG. 1, on which the deposition material is to be deposited.

A plurality of nozzles 132 and 142 are formed in top surfaces of the crucibles 131 and 141, i.e. the surfaces facing the substrate 20. When the second host material filled in the crucibles 131 and 141 is heated, the second host material moves through the nozzles 132 and 142 to the substrate 20. The shapes, the sizes, and the number of the nozzles 132 and 142 may vary based on the size of the substrate 20, properties of the deposition material, and conditions of a deposition process.

The second heating unit 115 may be disposed around (e.g., surrounding) the crucibles 131 and 141. The second heating unit 115 may include coils in, for example, a sine wave or zigzag pattern, and the coils may be connected to one or more external power sources (not shown).

The second heating unit 115 vaporizes the second host material filled in the crucibles 131 and 141 by providing thermal energy to the crucibles 131 and 141. The second heating unit 115 may be disposed on outer circumferences of the crucibles 131 and 141 so as to surround the crucibles 131 and 141. The second heating unit 115, in one embodiment, is connected to an external power source. The two crucibles 131 and 141, in one embodiment, are heated by the single second heating unit 115, and thus thermal energy may be uniformly or substantially uniformly supplied to the crucibles 131 and 141.

The first and second heating units 113 and 115, in one embodiment, may be separately controlled by being connected to separate power sources.

The first and second host vaporization sources 110 and 130, in one embodiment, are disposed in parallel with each other in one direction (e.g., in the X-axis direction). The first and second host materials that are vaporized by the first and second host vaporization sources 110 and 130, respectively, are uniformly mixed in a direction (e.g., in a Y-axis direction) that is perpendicular to the direction in which the first and second host vaporization sources 110 and 130 are disposed, or arranged.

The dopant vaporization source 150 may be a linear vaporization source. The dopant vaporization source 150 that is the linear vaporization source may include a crucible 151 and a heating unit 117. The crucible 151 is filled with a deposition material used for deposition. In one embodiment, a dopant material for forming an organic material included in an OLED may be filled in a solid or powder state into the crucible 151. However, the present invention is not limited thereto and various deposition materials in various states may be filled into the crucible 151.

The crucible 151 may linearly extend in a direction at an angle to a direction in which the first host vaporization source 110 is disposed, i.e. in a direction crossing the direction (e.g., the X-axis direction) in which the first vaporization source unit 110a and the second vaporization source unit 110b are disposed. According to one embodiment, a longitudinal direction (e.g., the Y-axis direction) of the crucible 151 may be perpendicular to the direction (e.g., the X-axis direction) in which at least one of the first vaporization source unit 110a or the second vaporization source unit 110b is disposed.

In one embodiment, a plurality of nozzles 152 is formed in a top surface of the crucible 151, i.e. the surface facing the substrate 20. A direction in which the nozzles 152 are disposed may be the same as the longitudinal direction (e.g., the Y-axis direction) of the crucible 151. In one embodiment, the direction in which the nozzles 152 are disposed may be perpendicular to a direction to which the nozzles 112, 122, 132, and 142 of the first vaporization source unit 110a, the second vaporization source unit 110b, the third vaporization source unit 130a, and the fourth vaporization source unit 130b are disposed.

The dopant vaporization source 150 is disposed between the first vaporization source unit 110a and the second vaporization source unit 110b and between the third vaporization source unit 130a and the fourth vaporization source unit 130b, and vaporizes the dopant material in such a way that the dopant material may be mixed with the first and second host materials in the direction (e.g., the X-axis direction) in which the first and second host vaporization sources 110 and 130 are disposed, as well as in a direction (e.g., the Y-axis direction) that is perpendicular to the direction in which the first vaporization source unit 110a and the second vaporization source unit 110b are disposed (or the direction in which the third vaporization source unit 130a and the fourth vaporization source unit 140b are disposed).

When the dopant material filled in the crucible 151 is heated, the dopant material moves through the nozzles 152 to the substrate 20. The shapes, the sizes, and the number of the nozzles 152 may vary based on the size of the substrate 20, properties of the deposition material, and conditions of a deposition process.

The heating unit 117 may be disposed around the crucible 151. The heating unit 117 may include coils in, for example, a sine wave or zigzag pattern, and the coils may be connected to one or more external power sources (not shown).

The heating unit 117 vaporizes the dopant material filled in the crucible 151 by providing thermal energy to the crucible 151. The heating unit 117 may be disposed on an outer circumference of the crucible 151 so as to surround the crucible 151. The heating unit 117 may be connected to an external power source.

As described above, in one embodiment, the first and second host vaporization sources 110 and 130 that vaporize the first and second host materials, respectively, are disposed in parallel with each other, the dopant vaporization source 150 that vaporizes the dopant material is disposed between the first and second vaporization source units 110a and 110b that vaporize the first host material and between the third and fourth vaporization source units 130a and 130b that vaporize the second host material, thereby increasing vacuum deposition regions of the first host material, the second host material, and the dopant material, and achieving a uniform or substantially uniform vacuum deposition rate thereof. As described above, the vacuum deposition regions and rate of the first host material, the second host material, and the dopant material are uniform or substantially uniform, and thus a room temperature lifetime of an organic light emitting device may be increased.

Figure 4:
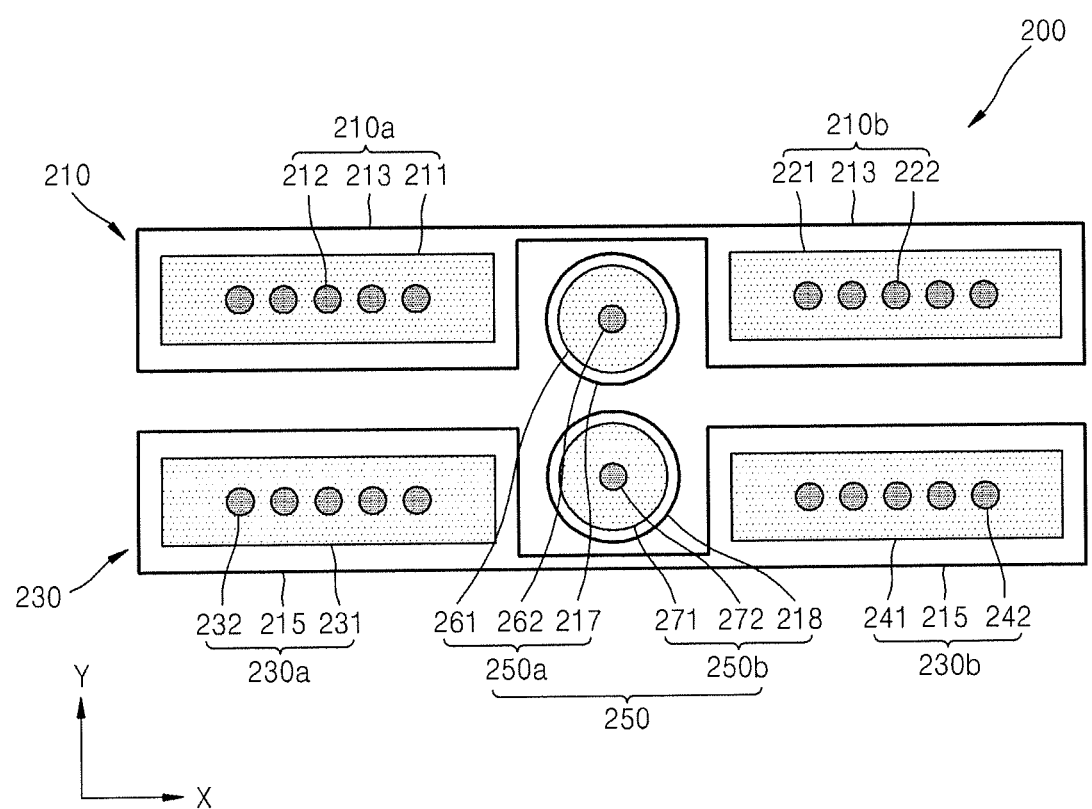
FIG. 4 is a plan view of a deposition source according to another embodiment of the present invention.

FIG. 4 is a plan view of a deposition source 200 according to another embodiment of the present invention. For purposes of illustration, the differences between the deposition source 200 shown in FIG. 4 and the deposition source 100 described above and shown in FIG. 3 are described below.

Referring to FIG. 4, the deposition source 200 includes a first host vaporization source 210, a second host vaporization source 230, and a dopant vaporization source 250.

The first host vaporization source 210, in one embodiment, includes a first vaporization source unit 210a, a second vaporization source unit 210b, and a first heating unit 213.

The first vaporization source unit 210a and the second vaporization source unit 210b may include crucibles 211 and 221, respectively, in which first host materials are contained, and the first heating unit 213. The crucibles 211 and 221 may linearly extend in a direction (e.g., an X-axis direction). A plurality of nozzles 212 and 222 are formed in top surfaces of the crucibles 211 and 221, i.e., surfaces facing the substrate 20. The nozzles 212 and 222 may be disposed in longitudinal directions (e.g., the X-axis direction) of the crucibles 211 and 221.

The first heating unit 213 may be disposed on outer circumferences of the crucibles 212 and 222. The two crucibles 211 and 221, in one embodiment, are heated by the single first heating unit 213, and thus thermal energy may be uniformly or substantially uniformly supplied to the crucibles 211 and 221.

The second host vaporization source 230, in one embodiment, includes a third vaporization source unit 230a, a fourth vaporization source unit 230b, and a second heating unit 215.

The third vaporization source unit 230a and the fourth vaporization source unit 230b may include crucibles 231 and 241, respectively, in which second host materials are contained, and the second heating unit 215. The crucibles 231 and 241 may linearly extend in a direction (e.g., the X-axis direction). A plurality of nozzles 232 and 242 are formed in top surfaces of the crucibles 231 and 241, i.e. the surfaces facing the substrate 20. The nozzles 232 and 242 may be disposed in longitudinal directions (e.g., the X-axis direction) of the crucibles 231 and 241.

The second heating unit 215 may be disposed on outer circumferences of the crucibles 231 and 241. The two crucibles 231 and 241, in one embodiment, are heated by the single second heating unit 215, and thus thermal energy may be uniformly or substantially uniformly supplied to the crucibles 231 and 241.

The deposition source 200 of FIG. 4 differs from the deposition source 100 shown in FIG. 3 in the dopant vaporization source 250. More specifically, the dopant vaporization source 150 of the deposition source 100 of FIG. 3 is a linear vaporization source, whereas the dopant vaporization source 250 of the deposition source 200 of FIG. 4 is a point source. The dopant vaporization source 250 may include a first point source 250a and a second point source 250b. The first point source 250a may be disposed between the first vaporization source unit 210a and the second vaporization source unit 210b. The second point source 250b may be disposed between the third vaporization source unit 230a and the fourth vaporization source unit 230b.

The first point source 250a and the second point source 250b may include crucibles 261 and 271, respectively, in which the same dopant material is contained. Nozzles 262 and 272 are formed in respective top surfaces of the crucibles 261 and 271, i.e. the surfaces facing the substrate 20.

A first heating unit 217 may be disposed on an outer circumference of the crucible 261 of the first point source 250a. A second heating unit 218 may be disposed on an outer circumference of the crucible 271 of the second point source 250b. The first heating unit 217 supplies thermal energy to the crucible 261 of the first point source 250a. The second heating unit 218 supplies thermal energy to the crucible 271 of the second point source 250b.

Figure 5:
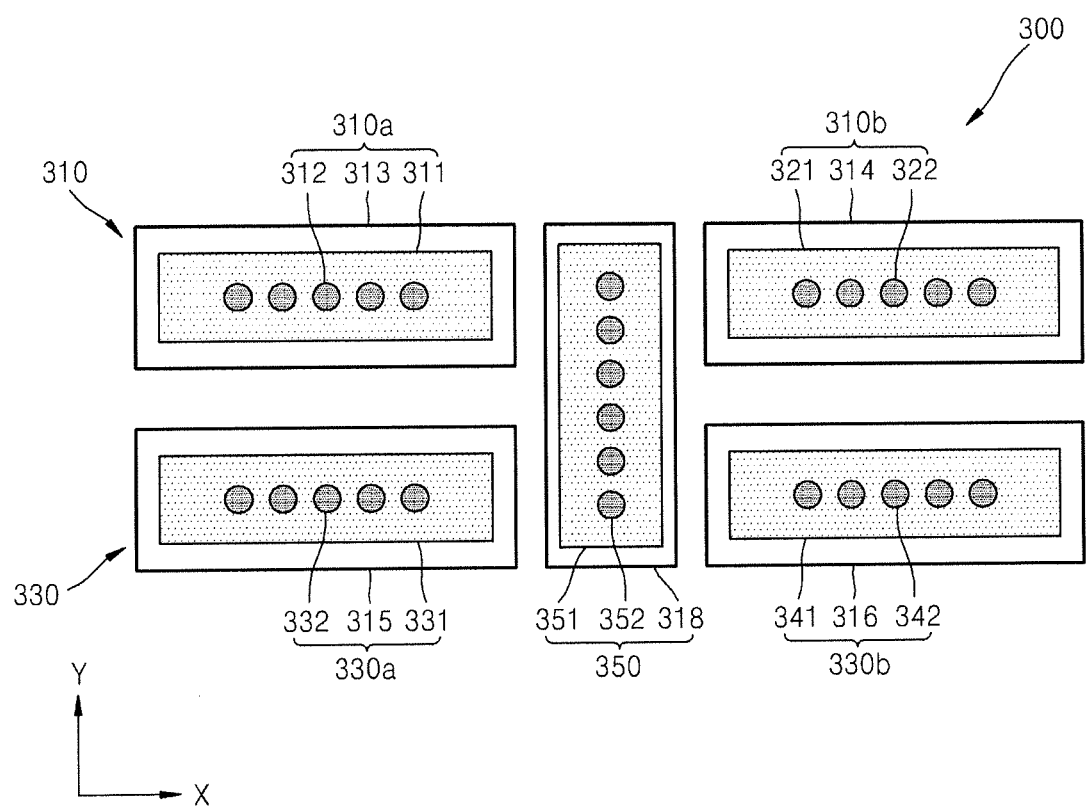
FIG. 5 is a plan view of a deposition source according to another embodiment of the present invention.

FIG. 5 is a plan view of a deposition source 300 according to another embodiment of the present invention. For purposes of illustration, the differences between the deposition source 300 of FIG. 5 and the deposition source 100 described above and shown in FIG. 3 are described below.

Referring to FIG. 5, the deposition source 300 includes a first host vaporization source 310, a second host vaporization source 330, and a dopant vaporization source 350.

The deposition source 300 of FIG. 5 differs from the deposition source 100 of FIG. 3 in the first host vaporization source 310 and the second host vaporization source 330. More specifically, the first host vaporization source 110 of the deposition source 100 of FIG. 3 supplies thermal energy in the crucible 111 of the first vaporization source unit 110a and the crucible 121 of the second vaporization source unit 110b by using the first heating unit 113, and the second host vaporization source 130 of the deposition source 100 of FIG. 3 supplies thermal energy in the crucible 131 of the third vaporization source unit 130a and the crucible 141 of the fourth vaporization source unit 130b by using the second heating unit 115, whereas a first vaporization source unit 310a and a second vaporization source unit 310b of the first host vaporization source 310 of the deposition source 300 of FIG. 5 include separate heating units 313 and 314, respectively, and a third vaporization source unit 330a and a fourth vaporization source unit 330b of the second host vaporization source 330 of the deposition source 300 of FIG. 5 include separate heating units 315 and 316.

In one embodiment, the first heating unit 313 is disposed on an outer circumference of a crucible 311 of the first vaporization source unit 310a, and supplies thermal energy to the crucible 311, and the second heating unit 314 separate from the first heating unit 313 is disposed on an outer circumference of a crucible 321 of the second vaporization source unit 310b, and supplies thermal energy to the crucible 321. Further, the third heating unit 315 is disposed on an outer circumference of a crucible 331 of the third vaporization source unit 330a, and supplies thermal energy to the crucible 331, and the fourth heating unit 316 separate from the third heating unit 315 is disposed on an outer circumference of a crucible 341 of the fourth vaporization source unit 330b, and supplies thermal energy to the crucible 341. The first through fourth heating units 313, 314, 315, and 316 may be connected to separate power sources.

As described above, the separate first through fourth heating units 313, 314, 315, and 316 supply, respectively, thermal energy to the first through fourth vaporization source units 310a, 310b, 330a, and 330b, thereby separately controlling temperatures of the first through fourth vaporization source units 310a, 310b, 330a, and 330b.

The crucibles 311 and 321 of the first host vaporization source 310 may linearly extend in a direction (e.g., an X-axis direction). A plurality of nozzles 312 and 322 are formed in top surfaces of the crucibles 311 and 321, respectively, i.e.

surfaces facing the substrate 20. The nozzles 312 and 322 may be disposed in longitudinal directions (e.g., the X-axis direction) of the crucibles 311 and 321. First host materials are contained in the crucibles 311 and 321.

The crucibles 331 and 341 of the second host vaporization source 330 may linearly extend in a direction (e.g., the X-axis direction). A plurality of nozzles 332 and 342 are formed in top surfaces of the crucibles 331 and 341, respectively, i.e. surfaces facing the substrate 20. The nozzles 332 and 342 may be disposed in longitudinal directions (e.g., the X-axis direction) of the crucibles 331 and 341.

In one embodiment, a direction in which the first and second vaporization source units 310a and 310b are disposed is parallel to a direction in which the third and fourth vaporization source units 330a and 330b are disposed.

The dopant vaporization source 350 of the deposition source 300 of FIG. 5 may be the same as the dopant vaporization source 150 of the deposition source 100 of FIG. 3. In one embodiment, the dopant vaporization source 350 is a linear deposition source and is disposed between the first and second vaporization source units 310a and 310b and between the third and fourth vaporization source units 330a and 330b. In one embodiment, a plurality of nozzles 352 are formed in a top surface of a crucible 351 of the dopant vaporization source 350. A direction in which the nozzles 352 are disposed may be the same as a longitudinal direction (e.g., a Y-axis direction) of the crucible 351. In one embodiment, the direction in which the nozzles 352 are disposed may be perpendicular to a direction in which the nozzles 312, 322, 332, and 342 of the first host vaporization source 310 and the second host vaporization source 330 are disposed. A heating unit 318 may be disposed around the crucible 351. The heating unit 318 vaporizes the dopant material filled in the crucible 351 by providing thermal energy to the crucible 351. The heating unit 318 may be disposed on an outer circumference of the crucible 351 so as to surround the crucible 351 and may be connected to an external power source.

Figure 6:
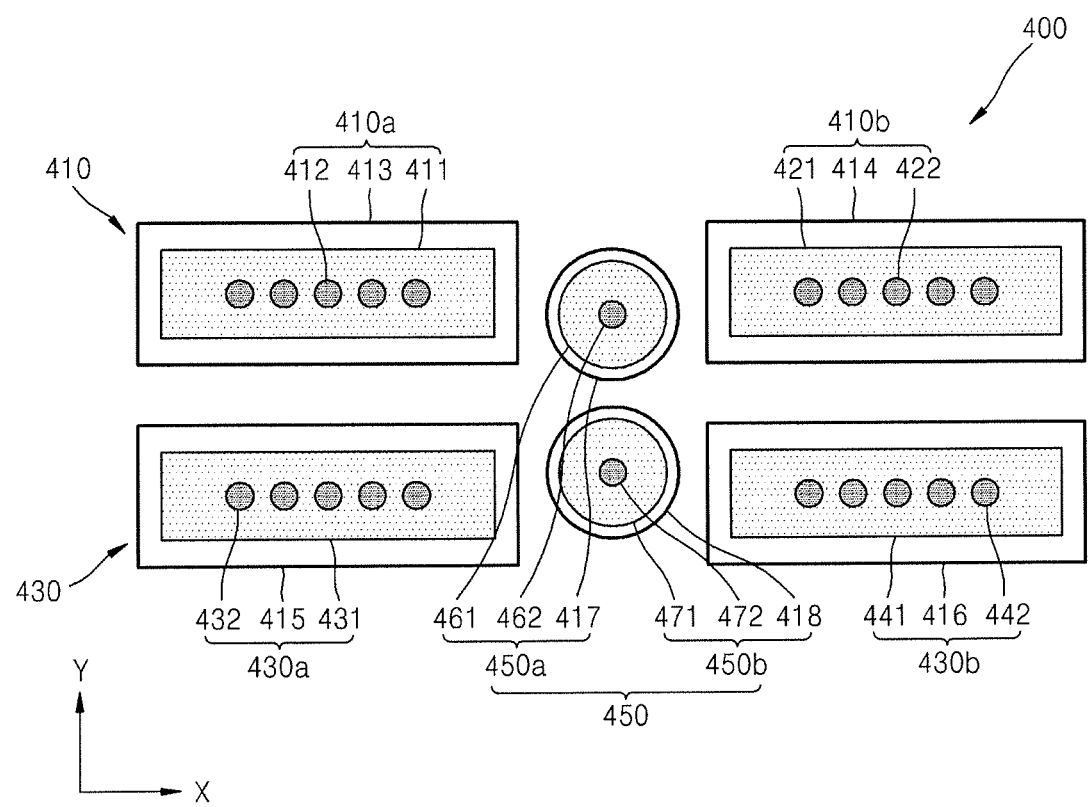
FIG. 6 is a plan view of a deposition source according to another embodiment of the present invention.

FIG. 6 is a plan view of a deposition source 400 according to another embodiment of the present invention. For purposes of illustration, the differences between the deposition source 400 shown in FIG. 6 and the deposition source 200 described above and shown in FIG. 4 are described below.

Referring to FIG. 6, the deposition source 400 includes a first host vaporization source 410, a second host vaporization source 430, and a dopant vaporization source 450.

The deposition source 400 of FIG. 6 differs from the deposition source 200 of FIG. 4 in the first host vaporization source 410 and the second host vaporization source 430. More specifically, the first host vaporization source 210 of the deposition source 200 of FIG. 4 supplies thermal energy in the crucible 211 of the first vaporization source unit 210a and the crucible 221 of the second vaporization source unit 210b by using the first heating unit 213, and the second host vaporization source 230 of the deposition source 200 of FIG. 4 supplies thermal energy in the crucible 231 of the third vaporization source unit 230a and the crucible 241 of the fourth vaporization source unit 230b by using the second heating unit 215, whereas a first vaporization source unit 410a and a second vaporization source unit 410b of the first host vaporization source 410 of the deposition source 400 of FIG. 6 include separate heating units 413 and 414, respectively, and a third vaporization source unit 430a and a fourth vaporization source unit 430b of the second host vaporization source 430 of the deposition source 400 of FIG. 6 include separate heating units 415 and 416.

In one embodiment, the first heating unit 413 is disposed on an outer circumference of a crucible 411 of the first vaporization source unit 410a, and supplies thermal energy to the crucible 411, and the second heating unit 414 separate from the first heating unit 413 is disposed on an outer circumference of a crucible 421 of the second vaporization source unit 410b, and supplies thermal energy to the crucible 421. Further, the third heating unit 415 is disposed on an outer circumference of a crucible 431 of the third vaporization source unit 430a, and supplies thermal energy to the crucible 431, and the fourth heating unit 416 separate from the third heating unit 415 is disposed on an outer circumference of a crucible 441 of the fourth vaporization source unit 430b, and supplies thermal energy to the crucible 441. The first through fourth heating units 413, 414, 415, and 416 may be connected to separate power sources.

As described above, the separate first through fourth heating units 413, 414, 415, and 416 supply, respectively, thermal energy to the first through fourth vaporization source units 410a, 410b, 430a, and 430b, thereby separately controlling temperatures of the first through fourth vaporization source units 410a, 410b, 430a, and 430b.

The crucibles 411 and 421 of the first host vaporization source 410 may linearly extend in a direction (e.g., an X-axis direction). A plurality of nozzles 412 and 422 are formed in top surfaces of the crucibles 411 and 421, respectively, i.e. surfaces facing the substrate 20. The nozzles 412 and 422 may be disposed in longitudinal directions (e.g., the X-axis direction) of the crucibles 411 and 421. First host materials are contained in the crucibles 411 and 421.

The crucibles 431 and 441 of the second host vaporization source 430 may linearly extend in a direction (e.g., the X-axis direction). A plurality of nozzles 432 and 442 are formed in top surfaces of the crucibles 431 and 441, respectively, i.e. surfaces facing the substrate 20. The nozzles 432 and 442 may be disposed in longitudinal directions (e.g., the X-axis direction) of the crucibles 431 and 441.

In one embodiment, a direction in which the first and second vaporization source units 410a and 410b are disposed is parallel to a direction in which the third and fourth vaporization source units 430a and 430b are disposed.

The dopant vaporization source 450 of the deposition source 400 of FIG. 6 may be the same as the dopant vaporization source 250 of the deposition source 200 of FIG. 4. That is, the dopant vaporization source 450 may be a point source. The dopant vaporization source 450 may include a first point source 450a and a second point source 450b. The first point source 450a may be disposed between the first vaporization source unit 410a and the second vaporization source unit 410b. The second point source 450b may be disposed between the third vaporization source unit 430a and the fourth vaporization source unit 430b.

The first point source 450a and the second point source 450b may include crucibles 461 and 471, respectively, in which the same dopant material is contained. Nozzles 462 and 472 are formed in respective top surfaces of the crucibles 461 and 471, i.e. the surfaces facing the substrate 20.

A first heating unit 417 may be disposed on an outer circumference of the crucible 461 of the first point source 450a. A second heating unit 418 may be disposed on an outer circumference of the crucible 471 of the second point source 450b. The first heating unit 417 supplies thermal energy to the crucible 461 of the first point source 450a. The second heating unit 418 supplies thermal energy to the crucible 471 of the second point source 450b.

As described above, according to embodiments of the present invention, vacuum deposition is uniformly or substantially uniformly performed on host and dopant materials, thereby increasing a room temperature lifetime of an organic light emitting device and improving emission efficiency thereof.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method for manufacturing an organic light emitting display (OLED), the method including depositing materials on a substrate using a deposition source, the deposition source comprising:
   a dopant vaporization source;
   a first host vaporization source comprising a first crucible of a first vaporization source unit on a side of the dopant vaporization source and a second crucible of a second vaporization source unit on another side of the dopant vaporization source; wherein the first vaporization source unit and the second vaporization source unit comprise linear vaporization sources;
   wherein each of the first vaporization source unit and the second vaporization source unit each comprises a plurality of nozzles next to each other arranged in a same direction as a direction in which the first vaporization source unit and the second vaporization source unit are arranged; and
   a second host vaporization source comprising, a third vaporization source unit on the side of the dopant vaporization source and arranged in parallel with the first vaporization source unit, and a fourth vaporization source unit on the another side of the dopant vaporization source and arranged in parallel with the second vaporization source unit.

2. The method of claim 1, wherein the dopant vaporization source comprises a linear vaporization source.

3. The method of claim 2, wherein a direction in which a plurality of nozzles of the linear vaporization source of the dopant vaporization source are arranged and a direction in which the first vaporization source unit and the second vaporization source unit are arranged cross each other.

4. The method of claim 3, wherein the direction in which the plurality of nozzles of the linear vaporization source of the dopant vaporization source are arranged and the direction in which the first vaporization source unit and the second vaporization source unit are arranged are perpendicular to each other.

5. The method of claim 1, wherein the dopant vaporization source comprises a point source.

6. The method of claim 1, wherein the dopant vaporization source comprises:
   a first point source between the first vaporization source unit and the second vaporization source unit; and
   a second point source between the third vaporization source unit and the fourth vaporization source unit.

7. The method of claim 1, wherein the first vaporization source unit and the second vaporization source unit are symmetrical to each other with respect to the dopant vaporization source.

8. The method of claim 1, wherein the third vaporization source unit and the fourth vaporization source unit are symmetrical to each other with respect to the dopant vaporization source.

9. The of claim 1, wherein each of the third vaporization source unit and the fourth vaporization source unit comprises a plurality of nozzles arranged in a same direction as a direction in which the third vaporization source unit and the fourth vaporization source unit are arranged.

10. The method of claim 1, wherein a direction in which the first vaporization source unit and the second vaporization source unit are arranged and a direction in which the third vaporization source unit and the fourth vaporization source unit are arranged are parallel to each other.

11. The method of claim 1, wherein the first vaporization source unit and the second vaporization source unit have a same size and shape.

12. The method of claim 1, wherein the third vaporization source unit and the fourth vaporization source unit have a same size and shape.

13. The method of claim 1, wherein the first host vaporization source further comprises a first heating unit surrounding the first crucible of the first vaporization source unit and the second crucible of the second vaporization source unit, the first heating unit being configured to heat the first crucible and the second crucible.

14. The method of claim 13, wherein the second host vaporization source further comprises a second heating unit surrounding a third crucible of the third vaporization source unit and a fourth crucible of the fourth vaporization source unit, the second heating unit being configured to heat the third crucible and the fourth crucible.

15. The method of claim 1, wherein the first host vaporization source further comprises a first heating unit surrounding the first crucible of the first vaporization source unit and being configured to heat the first crucible, and a second heating unit surrounding the second crucible of the second vaporization source unit and being configured to heat the second crucible.

16. The method of claim 15, wherein the second host vaporization source further comprises a third heating unit surrounding a third crucible of the third vaporization source unit and being configured to heat the third crucible, and a fourth heating unit surrounding a fourth crucible of the fourth vaporization source unit and being configured to heat the fourth crucible.

* * * * *